(12) United States Patent
Jo

(10) Patent No.: US 6,379,992 B2
(45) Date of Patent: Apr. 30, 2002

(54) METHOD FOR FABRICATING AN IMAGE SENSOR

(75) Inventor: Wan-Hee Jo, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/749,611

(22) Filed: Dec. 28, 2000

(30) Foreign Application Priority Data

Dec. 28, 1999 (KR) .............................. 99-63832

(51) Int. Cl.[7] ...................... H01L 21/00; H01L 21/4763
(52) U.S. Cl. ........................... 438/70; 438/71; 438/631
(58) Field of Search ............................ 438/69, 70, 71, 438/72, 626, 631, 634, 645; 445/24

(56) References Cited

U.S. PATENT DOCUMENTS

| | | | |
|---|---|---|---|
| 5,677,202 A | * 10/1997 | Hawkins et al. | ............... 437/3 |
| 5,954,559 A | * 9/1999 | Holmberg et al. | ............ 445/24 |
| 5,990,506 A | * 11/1999 | Fossum et al. | ............. 257/294 |
| 6,297,071 B1 | * 10/2001 | Wake | .......................... 438/70 |

* cited by examiner

Primary Examiner—Charles Bowers
Assistant Examiner—Viktor Simkovic
(74) Attorney, Agent, or Firm—Pillsbury Winthrop LLP

(57) ABSTRACT

A method capable of enhancing the uniformity of the color filter array and removing scum deposits from the surface of the color filter array to improve the yield ratio of the device is disclosed. The method includes the steps of (a) formulating devices on a substrate and forming a first and a second interlayer insulating layer and a first and a second metal line, wherein the devices include a photodiode; (b) forming an optical shielding layer on the second interlayer insulating layer; (c) using the optical shielding layer as a mask to perform a dry etching for the second inter layer insulating layer by a predetermined thickness, thereby producing a plurality of grooves; (d) utilizing the plurality of grooves to form a color filter array on the second inter layer insulating layer; (e) utilizing the optical shielding layer as a polishing stop layer to perform a chemical mechanical polishing, thereby planarizing the color filter array; and (f) sequentially depositing a low temperature layer and a device protection layer on the color filter array.

14 Claims, 5 Drawing Sheets

METHOD FOR FABRICATING AN IMAGE SENSOR

FIELD OF THE INVENTION

The present invention relates to a method for fabricating an image sensor; and, more particularly, to a method for fabricating an image sensor that will effectively prevent contamination of the surface of a color filter array.

DESCRIPTION OF THE PRIOR ART

Conventional image sensor include both charge coupled device (CCD) image sensors and complementary metal oxide semiconductor (CMOS) image sensors. The basic technology used to form the CMOS image sensor is common to both types of sensors.

The CMOS image sensor comprises a photo detector for detecting light and a logic circuit for converting the detected light into an electric signal representing data regarding the detected light. Although efforts have been made to increase the fill factor of the image sensor and thereby increase the sensor sensitivity, further increases in the fill factor are limited because the associated logic circuitry cannot be completely removed. The fill factor, sometimes referred to as the aperture efficiency, is the ratio of the size of the light-sensitive area to the size of the total pixel size. Accordingly, in order to increase the sensitivity of the light, a micro lens formation technology has been used to converge and focus the incident light onto the photo detector by changing the path of the light that reaches the lens on the outside of the photo detector. In order for the image sensor to detect and provide a color image, it typically must include both a photo detector for receiving the light and generating and accumulating charge carriers and a color filter array (CFA), i.e., a plurality of color filters sequentially arranged above the photo detector. The CFA typically uses one of two alternative three-color primary configurations, either red R, green G and blue B (RGB) or yellow Y, magenta M and cyan C (CMY). A plurality of micro-lenses may be positioned above the color filter array to increase the photo-sensitivity of the image sensor.

Although one inner polysilicon and three outer metal layers have been used to form the interconnector structures in the conventional image sensor, the third metal layer is typically completely removed from above each detector pixel, a passivation layer is deposited on each pixel and then the color filter array is fabricated.

Accordingly, in a conventional image sensor, increased thickness between a photodiode of each pixel and the corresponding color filter array results in a larger loss of the available light signal. Further, scum resulting from the under-development of the organic films used in forming the color filter array will tend to degrade the features of the resulting pixels Referring to FIG. 1, there is illustrated a conventional method for fabricating an image sensor. A field insulating layer 12 is formed on a silicon substrate 11 in order to isolate two neighboring pixels; a photodiode 13 is formed by implanting and/or diffusing impurity; and an inner connection polysilicon 14 is then formed on the field insulating layer 12. After a pre-metal dielectric (PMD) layer 15 for transmitting the light is deposited on the inner connection polysilicon 14, a first interlayer insulating layer 16 for insulating two neighboring metal lines is deposited. After a first metal line 17 and a second interlayer insulating layer 18 are sequentially deposited on the first interlayer insulating layer 16, a second metal line 19 is constructed on the second interlayer insulating layer 18 so as to be opposite to the first metal line 17.

After a third interlayer insulating layer 20 is formed to insulate neighboring metal lines is formed on the second metal line 19, a third metal layer is deposited. This third metal layer will be only used to formulate metal lines for the peripheral circuits and will typically be removed completely from the light sensing areas of the unit pixel. After the third metal layer is removed, a high temperature process is used to form an oxide layer, a nitride layer or a multi-layer film of oxide and nitride layers, on the third interlayer insulating layer 20 to provide a device protection layer 21 that will protect the device from moisture and mechanical damage.

After a color photoresist layer for providing color sensitivity is deposited on the device protection layer 21, developing processes are performed to generate the color filter array, i.e., an array of a blue color filter 22, a red color filter 23 and a green color filter 24. The red color filter 23 is thicker than the blue color filter 22 by a predetermined thickness and the green color filter 24 is, in turn, thicker than the red color filter 23 by another predetermined thickness. The differences in thickness between the various filters produces a color filter array having a stepped structure that tends to be contaminated by scum deposits (A, B, C). The scum is not primarily deposited on the oxide device protection layer 21, but is more typically found on photoresist layers that form the color filter array. For example, in the process of sequentially forming the color filter array of the blue color filter 22, the red color filter 23 and the green color filter 24, the scum deposits A and B produced during formation of the red color filter 23 or the green color filter 24 may remain on the blue color filter 22. Similarly, the scum deposits produced during the formation of the blue color filter 22 may remain under the red color filter 23, while scum originating from the green color filter 24 may remain on the red color filter 23. However, although the scum originating from the blue color filter 22 may remain on the device protection layer 21, because the device protection film 21 and the blue color filter 22 are formed from dissimilar materials, scum is not typically found on the oxide layer. Further, because the scum remaining on the red color filter 23 originates primarily from the green color filter 24, the upper regions of the color filter array may frequently suffer from scum deposits.

Three color filters in the color filter array are necessarily stepped as a result of the three fabricating processes of the color filter array.

If the stepped color filter array is planarized, the last formed color filter in the CFA is thicker than the previously formed color filters. As a result, the final thicknesses typically increase in sequence from the blue color filter 22, to the red color filter 23, and finally to the green color filter 24.

An over coating material (OCM) 25 is formed on the color filter array, wherein the over coating material 25 is used to perform a flattening or planarization process with respect to the stepped color filter array. A plurality of micro-lenses 26 is then formed on the over coating material 25 above the color filter array.

As a result of this process, the conventional method for fabricating a color filter array typically results in scum from the photoresist material being found on the color filter array.

SUMMARY OF THE INVENTION

It is, therefore, an object of the present invention to provide a method capable of enhancing the uniformity of the color filter array and removing the scum on the surface of the color filter array to improve the yield ratio of the device.

In accordance with a preferred embodiment of the present invention, there is provided a method for fabricating an image sensor, comprising the steps of: (a) formulating devices on a substrate and forming a first and a second interlayer insulating layer and a first and a second metal pattern, wherein the devices include a photodiode; (b) forming an optical shielding layer on the second interlayer insulating layer; (c) using the optical shielding layer as a mask to perform a dry etch of the second inter layer insulating layer to remove a predetermined thickness, thereby producing a plurality of grooves; (d) filling the plurality of grooves to form a color filter array on the second inter layer insulating layer; (e) utilizing the optical shielding layer as a polishing stop layer to perform a chemical mechanical polishing (CMP), thereby planarizing the color filter array; and (f) sequentially depositing both a low temperature layer and a device protection layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Referring to FIGS. 2A to 2G, there is illustrated a method for fabricating an image sensor in accordance with the present invention by significantly modifying the conventional image sensor fabrication process with the inner connection polysilicon and the three-layer metal line structure.

Figure 1:
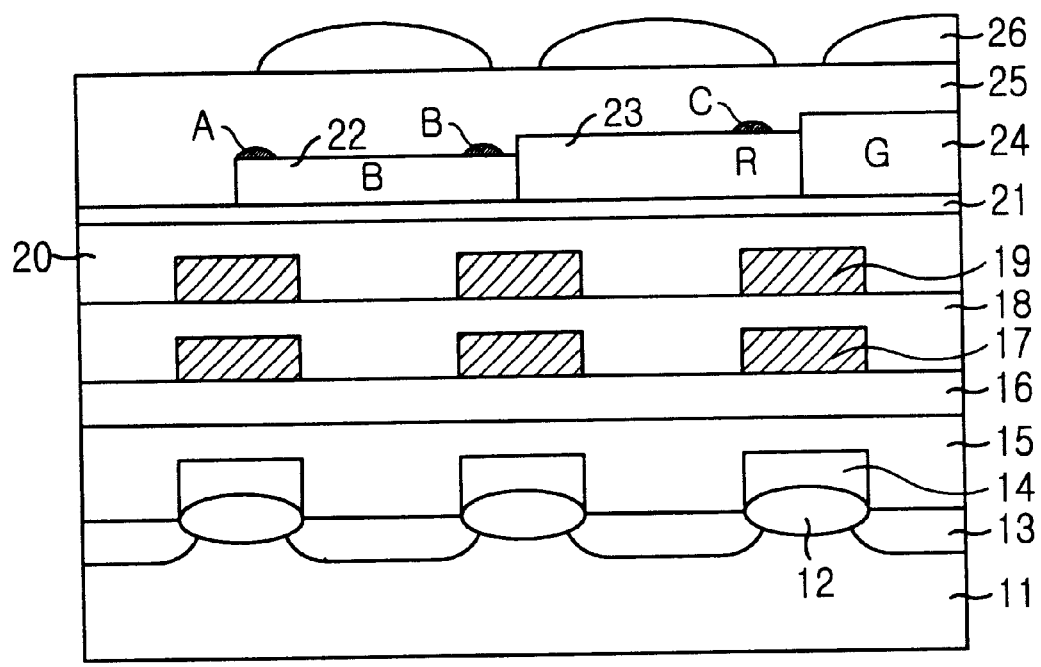
FIG. 1 represents a schematic method for fabricating a conventional image sensor.
Figure 2A:
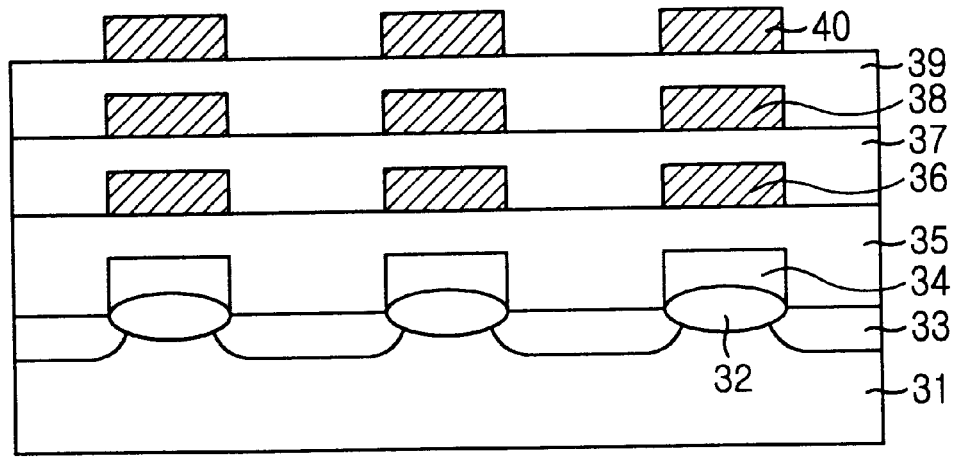
FIGS. 2A to 2G show a method for fabricating an image sensor in accordance with the present invention.

Referring to FIG. 2A, a field insulating layer 32 is formed on a silicon substrate 31 to separate adjacent pixels electrically from each other. A photodiode 33 is then formed by a conventional impurity diffusion or an ion implantation technique. A layer of polysilicon is then deposited on the field insulating layer 32, and conventional selective patterning and etch techniques are used to form an inner connection polysilicon pattern 34.

After a light transmitting insulating layer, e.g., a pre-metal dielectric layer 35, is deposited and planarized, a first metal layer is deposited on the pre-metal dielectric layer 35 and selectively patterned to form a first metal line 36 on the pre-metal dielectric layer 35 except above the photodiode 33. After a first interlayer insulating layer 37, for insulating adjacent metal lines from each other, is deposited and planarized on the first metal line 36, a second metal layer is deposited on the first interlayer insulating layer 37 and selectively patterned and etched to generate a second metal line 38 positioned generally above the first metal line 36.

After a second interlayer insulating layer 39 for insulating the adjacent metal lines 38 from each other is deposited and planarized, a third metal layer for generating an optical shielding layer is deposited on the second interlayer insulating layer 39. After a photoresist layer is deposited on the third metal layer and patterned utilizing conventional photolithography exposure and developing processes, the patterned photoresist layer is used as a mask for etching the third metal layer, thereby forming an optical shielding layer 40. While the metal layer within the unit pixel in the prior art is completely etched except with regard to peripheral circuits, the optical shielding layer 40 is formed in accordance with the present invention in order to prevent light being from transmitted into the circuits neighboring the unit pixel while allowing transmission to the region of the color filter array and the underlying photodiode. Further, the optical shielding layer 40 has an electrically shielded structure and may be used as a third metal line for connecting neighboring circuits with the exception of the photodiode 33.

Figure 2B:
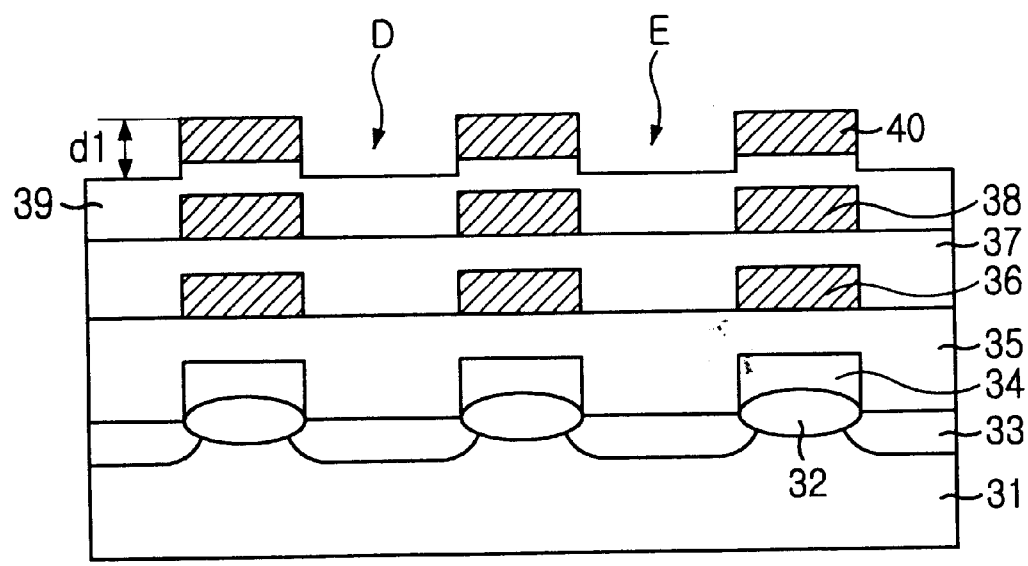

Referring to FIG. 2B, the optical shielding layer 40 is used as a mask to etch a portion of the second interlayer insulating layer 39 using a dry etching technique, thereby generating first and a second groove regions D and E, each having a predetermined thickness. The thickness of the conventional color filter array is determined by the thickness of the photosensitive layers deposited to form each of the color filters. Controlling the thickness of the color filter array, therefore, requires controlling the thickness of the various photosensitive layers. In contrast, the present invention permits the thickness of the color filter array to be controlled by adjusting the dry etch process to remove a portion of the second interlayer material to set the thickness (d1) of the resulting homogeneous color filter array. The second interlayer insulating layer 39 under the optical shielding layer 40 is not etched and remains intact while a portion of the second interlayer insulating layer 39 is removed in the first and second groove regions D and E. These groove regions will, in turn, be used in forming the green and blue color filters.

Figure 2C:
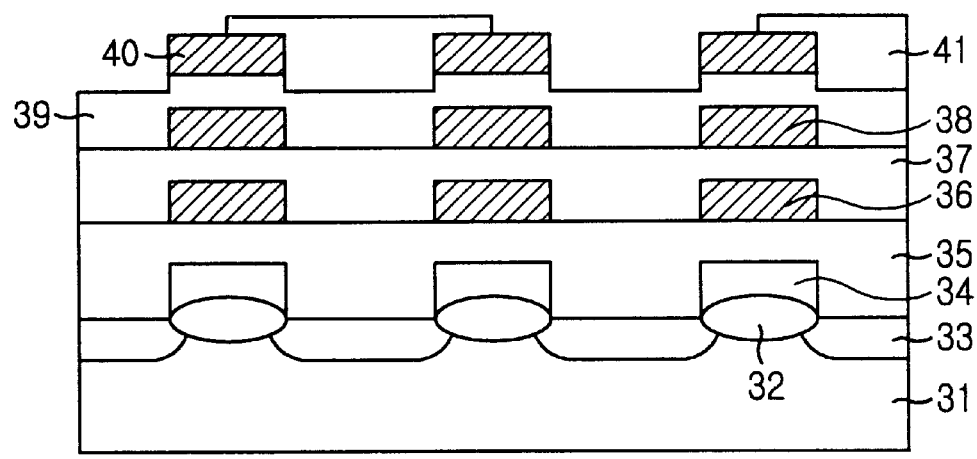

Referring to FIG. 2C, a color material, e.g., a negative photoresist, is deposited on the dry-etched first groove region D of the second interlayer insulating layer 39; a green color filter 41 is then formed by selective exposure and developing processes that remove all but the illuminated regions of the photoresist layer. It is preferable that the green color filter 41 be formed first, simply because the number of green color filters in the final array 41 are double that of either the red color filters or the blue color filters. In other words, the minimum amount of scum may accumulate under the green color filter while the maximum amount of scum may be accumulated on the green color filter so that the next process, e.g., the planarization process, may be used to remove substantially all of the deposited scum.

Figure 2D:
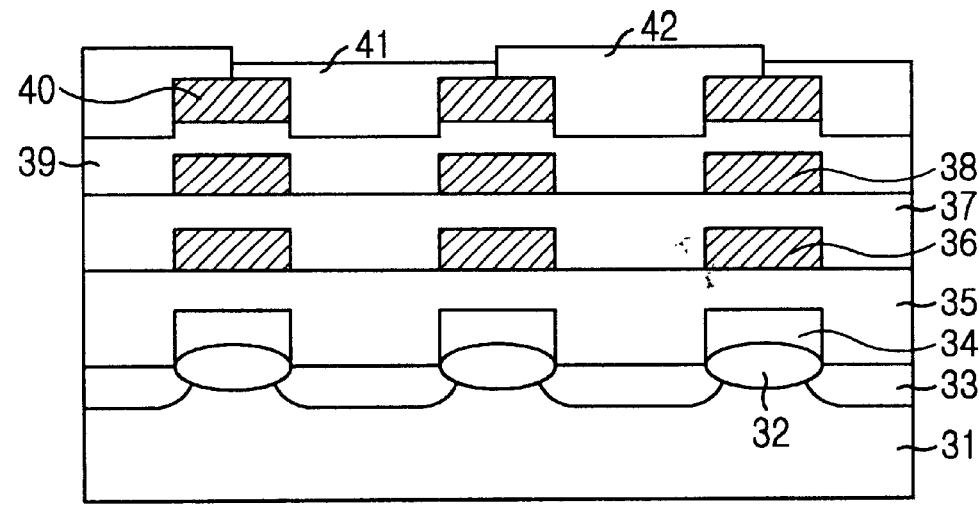

Referring to FIG. 2D, a color material, e.g., a negative photoresist, is deposited in the second groove region E of the second interlayer insulating layer 39; and exposure and developing processes are used to form the blue color filter 42. The thickness of the blue color filter 42 is generally about 0.2 $\mu$m greater than that of the green color filter 41.

Figure 2E:
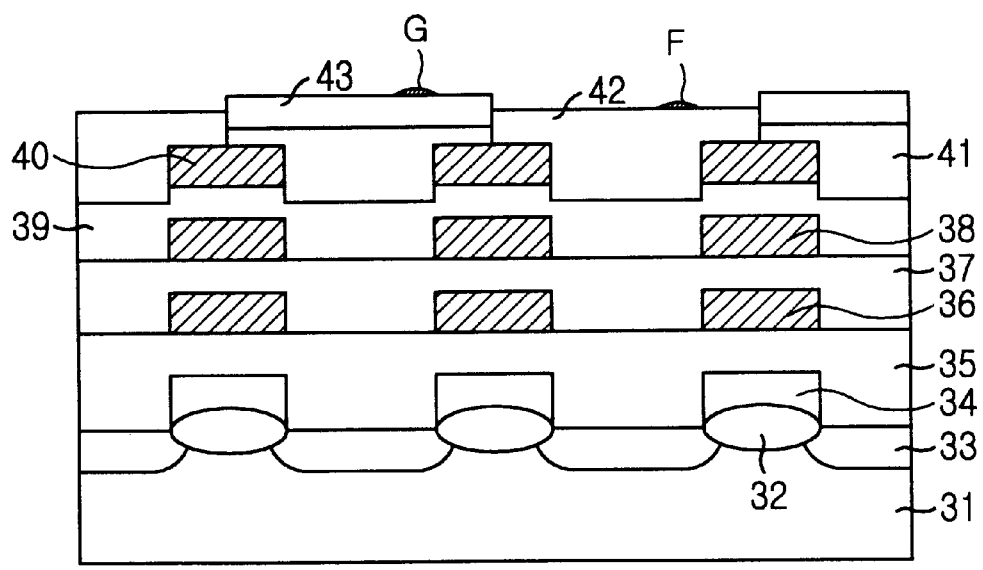

Referring to FIG. 2E, a negative photoresist is then deposited in another groove region (not shown) and the developing process is used to form the red color filter 43. The thickness of the negative photoresist for the red color filter 43 is generally about 0.2 $\mu$m thicker than that of the negative photoresist for the blue color filter 42 and the green color filter 41 is followed by the red color filter 41. Accordingly, the color filter array is formed as described above, wherein the color filters in the color filter array have different thicknesses so that the color filter array is stepped and the scum deposits F and G remain primarily on the surface of the color filters.

Figure 2F:
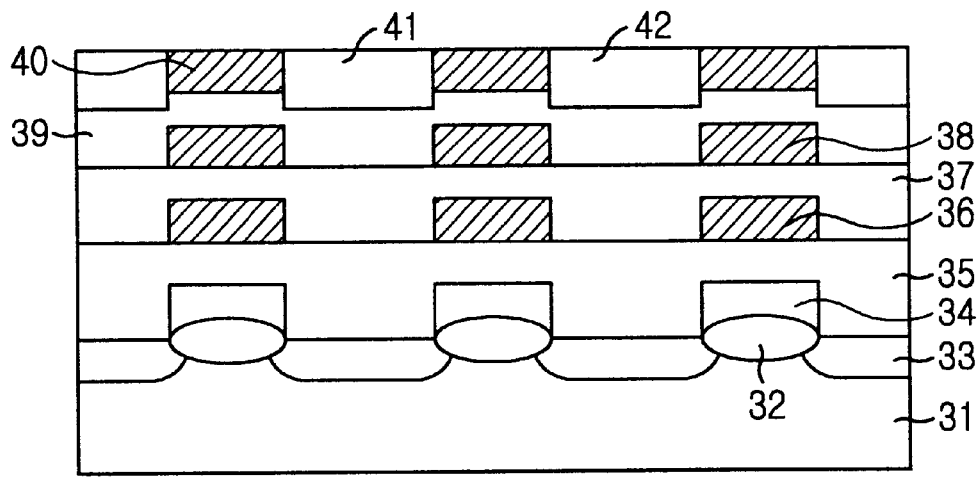

Referring to FIG. 2F, the optical shielding layer 40 is used as a polishing stop layer to perform a chemical mechanical polishing (CMP). Accordingly, the green color filter 41, the blue color filter 42 and the red color filter 43 are polished to be planarized so that the red color filter 43 is removed during the formation of the green filter 41. The scum F and G on the color filter array is completely removed and the thickness in the color filter array is standardized.

Figure 2G:
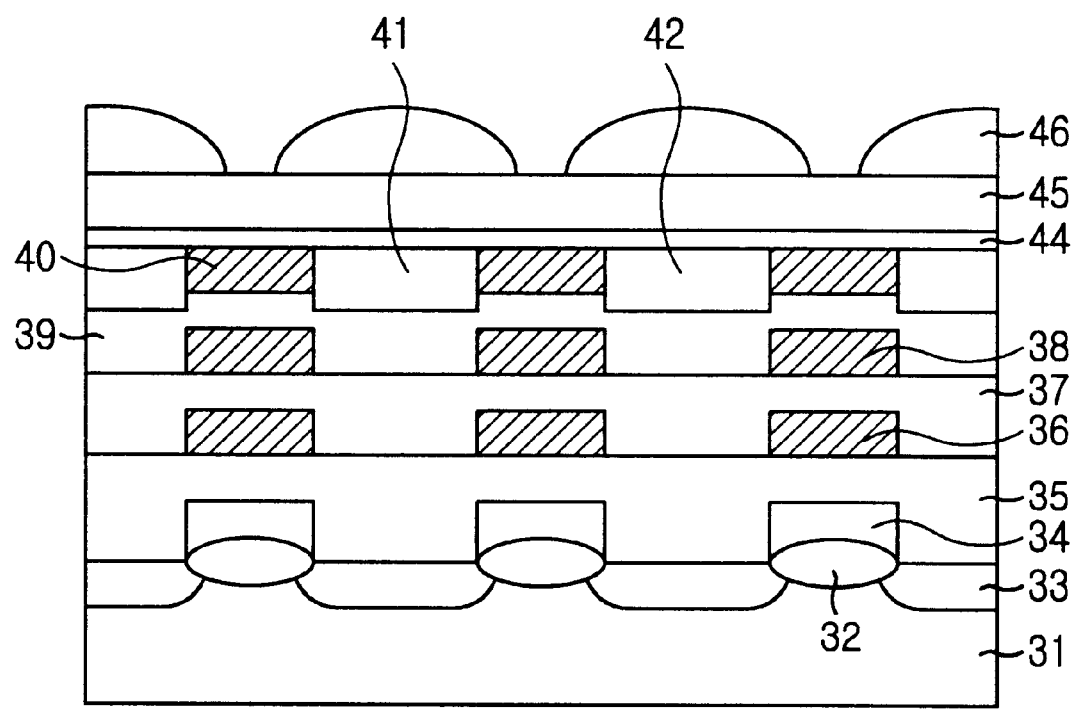

Referring to FIG. 2G, a low temperature oxide (LTO) layer 44 is deposited on the color filter array. The low temperature oxide layer 44 protects the color filter array during the next passivation process. The low temperature oxide layer 44 is used to separate the photoresist from the oxygen gas, thereby preventing oxidation of the color filter array. A passivation layer 45 is then formed on the low temperature oxide layer 44. The passivation process may be the same low temperature process that was also used to form the low temperature oxide layer 44. The passivation process is intended to further protect the image sensor by preventing damage to the color filter array.

Micro lenses 46 are then formed on the passivation layer 45 in locations corresponding to the color filter array. Since the color filter array according to the present invention was previously planarized, the over coating material (OCM), used in the prior art process as a planarizing layer, may be omitted from the present process.

Because, as described above, the color filter array is incorporated within the second interlayer insulating layer 39 and the metal layer 40, the color filter array elements will suffer less damage during the formation of the color filter array.

Further, because the metal layer 40 is used as a polishing stop layer, the deposited scum may be removed from the surface of the color filter array.

Because the etching thickness of the interlayer insulating layer under the color filter array may be controlled, the resulting thickness of the color filter array may also be controlled.

Because the color filters 41, 42 and 43 have the same thickness, uniformity between two neighboring pixels may be guaranteed. And because the distance between the photodiode 33 and the color filter array may be reduced, the optical signal strength may be increased.

While the invention has been shown and described with respect to the preferred embodiments, it will be understood by those skilled in the art that various changes and modifications may be made without departing from the spirit and scope of the invention as defined in the following claims.

What is claimed is:

1. A method for fabricating an image sensor, comprising the steps of:
    (a) formulating devices on a substrate and forming a first and a second interlayer insulating layer and a first and a second metal line, wherein the devices include a photodiode;
    (b) forming an optical shielding layer on the second interlayer insulating layer;
    (c) using the optical shielding layer as a mask to perform a dry etching for the second inter layer insulating layer by a predetermined thickness, thereby producing a plurality of grooves;
    (d) filling the plurality of grooves to generate a color filter array on the second inter layer insulating layer;
    (e) utilizing the optical shielding layer as a polishing stop layer to perform a chemical mechanical polishing, thereby planarizing the color filter array; and
    (f) depositing a low temperature layer and a device protection layer sequentially.

2. The method as recited in claim 1, wherein the step (a) further includes the step of, before forming the first interlayer insulating layer, shaping a pre-metal dielectric layer on the photodiode.

3. The method as recited in claim 1, wherein the optical shielding layer is used as a third metal line at the step (b).

4. The method as recited in claim 1, wherein the color filter array is formed as a sequence of a green color filter, a blue color filter and a red color filter at the step (d).

5. The method as recited in claim 1, wherein the device protection layer is formulated by a low temperature process and the step (f) further includes the step of creating a plurality of micro-lenses on the device protection layer.

6. The method as recited in claim 1, wherein the separation distance between the photodiode and the color filter array is considered to perform a dry etching for the second inter layer insulating layer.

7. A method for forming a color filter array for a color image sensor comprising the steps of:
    forming isolation regions on a semiconductor substrate, the isolation regions defining a plurality of active regions;
    forming photo detectors in the active regions of the semiconductor substrate;
    forming an insulating layer;
    forming a metal layer on the insulating layer;
    removing portions of the metal layer to form a metal pattern that exposes portions of the insulating layer above the photodetectors;
    etching the exposed portions of the insulating layer to remove a predetermined thickness of the insulating layer to form a plurality of grooves in the insulating layer;
    sequentially forming a first color filter in a first set of grooves, a second color filter in a second set of grooves, and a third color filter in a third set of grooves;
    planarizing the color filters to form a color filter array using the metal pattern as a planarization endpoint; and
    depositing a protective layer on the color filter array.

8. A method according to claim 7, wherein the step of sequentially forming each of the first, second, and third color filters further comprises
    coating the metal pattern and the grooves with a layer of photosensitive material;
    selectively exposing predetermined portions of the layer of photosensitive material that will form a color filter; and
    removing the remaining portion of the layer of photosensitive material.

9. A method according to claim 8, wherein the first color filter is a green color filter.

10. A method according to claim 7, wherein the step of planarizing the color filters further comprises a chemical mechanical polishing process.

11. A method according to claim 10, wherein the step of etching the exposed portions of the insulating layer further comprises a plasma etch process.

12. A method according to claim 11, wherein the plasma etch process is substantially anisotropic.

13. A method according to claim 7, wherein the step of depositing a protective layer on the color filter array further comprises forming a low temperature oxide layer.

14. A method according to claim 13, wherein the step of depositing a protective layer on the color filter array further comprises forming a passivation layer on the low temperature oxide layer.

* * * * *